(12) United States Patent
Miki et al.

(10) Patent No.: US 6,927,635 B2
(45) Date of Patent: Aug. 9, 2005

(54) LOCK DETECTORS HAVING A NARROW SENSITIVITY RANGE

(75) Inventors: Kazuhiko Miki, Round Rock, TX (US); David W. Boerstler, Round Rock, TX (US)

(73) Assignees: Toshiba America Electronic Components, Inc., Irvine, CA (US); International Business Machines Corporation, Armonk, NY (US)

( * ) Notice: Subject to any disclaimer, the term of this patent is extended or adjusted under 35 U.S.C. 154(b) by 84 days.

(21) Appl. No.: 10/641,491

(22) Filed: Aug. 14, 2003

(65) Prior Publication Data

US 2005/0046486 A1 Mar. 3, 2005

(51) Int. Cl.[7] .................................................. H03L 7/00
(52) U.S. Cl. ............................. 331/1 A; 331/16; 331/17; 331/DIG. 2; 331/74
(58) Field of Search ...................... 331/1 A, 16, DIG. 2, 331/74, 17

(56) References Cited

U.S. PATENT DOCUMENTS

| | | | |
|---|---|---|---|
| 3,988,696 A | 10/1976 | Sharpe | |
| 4,617,520 A | 10/1986 | Levine | |
| 5,057,793 A | 10/1991 | Cowley | |
| 5,124,671 A | 6/1992 | Srivastava | |
| 5,142,246 A | 8/1992 | Petersson | |
| 5,220,295 A | 6/1993 | Glover et al. | |
| 5,307,382 A | 4/1994 | Pang | |
| 5,525,932 A | 6/1996 | Kelkar et al. | |
| 5,656,977 A | 8/1997 | Kelkar et al. | |
| 5,694,440 A | 12/1997 | Kallman et al. | |
| 5,724,007 A | 3/1998 | Mar | |
| 5,734,273 A | 3/1998 | Stephen et al. | |
| 5,870,002 A | 2/1999 | Ghaderi et al. | |
| 5,909,130 A | 6/1999 | Martin et al. | |
| 5,940,609 A | 8/1999 | Harrison | |
| 5,969,576 A | 10/1999 | Trodden | |
| 6,133,769 A | 10/2000 | Fontana et al. | |
| 6,252,444 B1 | 6/2001 | Lee | |
| 6,314,150 B1 | 11/2001 | Vowe | |
| 6,320,469 B1 | 11/2001 | Friedberg et al. | |
| 6,434,206 B1 * | 8/2002 | Yu ............................. | 331/17 |

FOREIGN PATENT DOCUMENTS

| | | |
|---|---|---|
| JP | H10-98379 | 4/1998 |
| JP | P2002-185316 A | 6/2002 |

* cited by examiner

*Primary Examiner*—Michael B Shingleton
(74) *Attorney, Agent, or Firm*—Hogan & Hartson, LLP (57) ABSTRACT

Lock detectors are provided that have a narrow sensitivity range.

64 Claims, 9 Drawing Sheets

LOCK DETECTORS HAVING A NARROW SENSITIVITY RANGE

BACKGROUND

The present invention relates generally to phase locked loops (PLLs), and more specifically to lock detectors used in phase-locked loops.

Phase-Locked Loop Circuits

Phase-locked loop (PLL) circuits are used in many applications, including clock synthesizers, communication circuits, and frequency synchronization, among others. PLL circuits are used to provide an output signal that is phase-locked to an input reference signal. The feedback signal to phase/frequency detector is of the same frequency as the input reference signal.

Conventional PLL circuits typically include a phase/frequency detector (PFD), a charge pump with a loop filter such as a low-pass filter, and a voltage-controlled oscillator (VCO). The PFD is responsive to two signals: the PLL input reference signal, and a feedback signal that is generated from a VCO output signal that is fed back through a divider. When the feedback signal is substantially the same frequency and phase as the input reference signal, then the PLL circuit is "phase-locked." When the PLL circuit is phase-locked, the two outputs of the PFD, namely, an UP, and a DOWN signal both assume a first logic level indicative of this condition, which may be a logic low level. These signals are used to control the charge pump to increase or decrease its output control voltage VC.

If the input signal leads the feedback signal, indicating that the VCO is running too slow, the PFD produces the pump UP signal (UP) that continues until the rising edge of the feedback signal. Thus, the UP signal may be characterized by a pulse width indicative of the phase difference between the input reference signal, and the feedback signal.

By contrast, if the feedback signal that is input to the PFD leads the input reference signal, the PFD produces a pump DOWN signal that is triggered on the rising edge of the feedback input, and continues until the rising edge of the PLL input reference signal. The DOWN pulse can also be characterized by a pulse width that is indicative of the phase difference between the input reference signal, and the feedback signal.

As a result, the PFD forces the VCO to run faster or slower based on the relationship between the PLL input reference signal, and the feedback signal.

The PLL circuit is characterized by an overall transfer function. Accordingly, before the VCO output locks to the PLL input, a startup interval occurs wherein the feedback signal oscillates about the input reference signal (i.e., undershoots, and overshoots the input reference signal) before a steady state, phase-locked condition is achieved. From an initial power on state of the PLL circuit, thousands and even millions of cycles may be required before this steady state, phase-locked condition is reached.

Lock Detector

In many applications, it is crucial for the system to know at all times whether the system clock, which is usually generated by a PLL, is in lock condition in order to ensure data integrity. Lock-detector circuits can be used for this purpose.

PLL lock detectors are typically used to ensure that a steady-state phase-lock has actually been achieved by the PLL circuit. In many cases, the PLL may appear to be locked when it is not actually locked. For example, during operation of the PLL circuit, the absence of pulses on either the UP or DOWN output terminals of the PFD may appear to be a phase-locked condition, but in reality may be a transitory phase-locked condition that despite lasting several clock cycles is not truly a steady-state phase-lock.

In addition, once the PLL circuit is locked in steady state, it is desirable that detector circuits are immune from minor drifts that can generate pulses on either the UP or DOWN output terminals of the PFD, without discontinuing the logical lock signal.

Of the various lock detector circuits that have been proposed, some require large frequency counters to monitor the frequency of the reference input signal and the signal at the output of the VCO divider. These schemes consume large area of silicon and power, and typically provide only for frequency lock detection, not phase-lock detection. The counters consume significant power because the counters continuously toggle during steady-state locked conditions. Counters can also introduce digital switching noise that can limit the performance of analog components that are used in mixed-signal PLL designs. Further, existing lock-detect circuits typically do not address the failure to lock situation when the reference frequency disappears or deviates significantly from the intended frequency.

Detector circuits have been implemented using pulse discriminators to determine when UP or DOWN pulses of greater than a predetermined pulse width are being generated. Every time the pulse discriminators indicate that wide UP/DOWN pulses have been detected (i.e., indicating that a "near phase-lock" condition has been lost), a free running digital counter is then reset, and the counting process is restarted. However, if the pulse discriminators do not indicate that wide UP/DOWN pulses have been generated before the digital counter counts a preselected number of cycles, the output of the digital counter changes state, which can generate a logical lock signal indicating that a steady state phase-lock has been obtained.

Another approach is to employ a resistor/capacitor (RC) filter responsive to each of the UP and DOWN pulse trains. The respective filters provide a zero pulse output when the phase-locked loop circuit is near phase-lock but provides a non-zero output otherwise. Such an RC filter arrangement is coupled to a corresponding RC charging circuit that is discharged whenever the filtered pulses are non-zero, indicating that the PLL circuit is not locked.

Both of the above-mentioned approaches taken in the art is that each require a large silicon area to implement since digital counters and RC charging circuits are relatively large.

Furthermore, with respect to the RC filter approach, such filters are not typically implemented with a high degree of accuracy. For example, over typical fabrication process variation, the time constant of such RC filters can vary between 10–20%. This variance can directly affect the ability of the lock detector to detect a steady-state phase-locked condition.

Conventional approaches to lock detection suffer from insufficient detection sensitivity with respect to phase error. For example, many lock detectors will output a detection signal when the phase error is as high as 10 picoseconds. However, high performance PLLs require a dead zone of less than 2 picoseconds, and ideally would have zero dead zone. Thus, lock detectors that output a detection signal when the phase error is as high as 10 picoseconds can suffer from precision problems. Moreover, in some lock detectors, the detection sensitivity depends on the frequency of a reference clock or a Voltage Controlled Oscillator (VCO).

Accordingly, there is a need to provide an improved lock detector that reduces or eliminates one or more of the problems set forth above.

SUMMARY

Lock detectors are provided that have a narrow sensitivity range.

BRIEF DESCRIPTION OF DRAWINGS

The following discussion may be understood with reference to the various views of the drawings, described in summary below, which form a part of this disclosure.

DETAILED DESCRIPTION

In the following detailed description of the embodiments, reference is made to the accompanying drawings that show, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled. Like numbers refer to like elements throughout.

Aspects of the present invention can provide lock detectors that have a narrow sensitivity range in detecting a steady state locked condition, and that can detect a very small phase error. Embodiments of the lock detector do not require delay lines that can be difficult to manufacture with appropriate tolerances and can limit the frequency range for lock detection. In addition, the lock detector does not utilize counters that consume large amounts of power and introduce digital switching noise that can limit the performance of analog components used in a mixed-signal phase locked loop design.

Embodiments can provide lock detection over an extended frequency range, consume low amounts of power, are easy to manufacture, consume relatively little area, and can detect both a frequency-lock condition and a phase-lock condition. In addition, embodiments do not require adjustments and additional overhead as PLL configurations are changed, such as multiplication factors.

Figure 1:
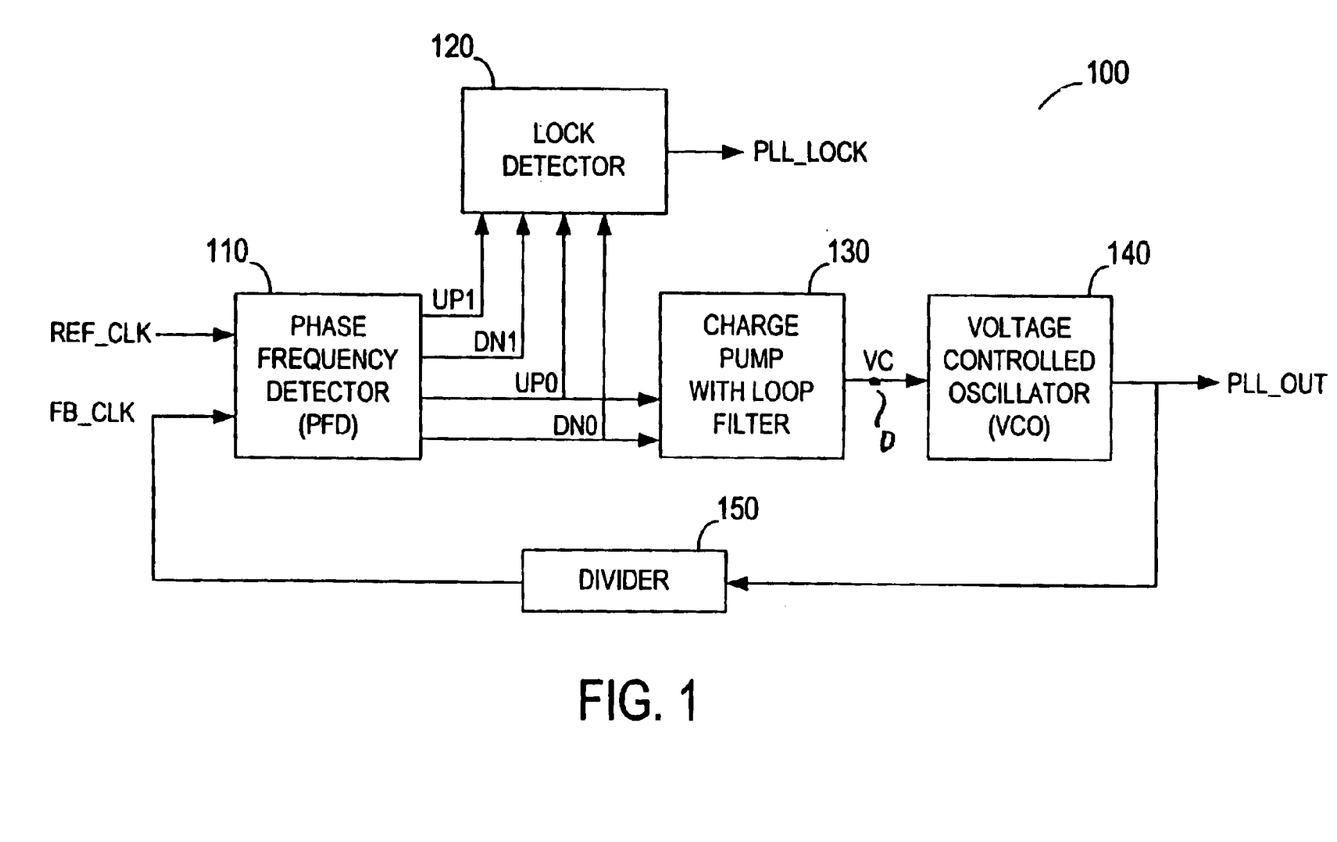
FIG. 1 is a block diagram of a phase-locked loop having a phase/frequency detector that generates UP0, UP1, DN0, and DN1 signals and a lock detector responsive to the UP0, UP1, DN0, and DN1 signals.

FIG. 1 is a block diagram of a phase-locked loop having a phase/frequency detector that generates UP0, UP1, DN0, DN1 signals and a lock detector responsive those signals. The phase-locked loop (PLL) circuit 100 is connected to the lock detector 120. The PLL circuit 100 includes a phase/frequency detector (PFD) 110, a charge pump 130 with a loop filter, a voltage controlled oscillator (VCO) 140, and, optionally, a divider 150.

The phase/frequency detector 110 has inputs capable of receiving an input clock signal REF_CLK, and a feedback signal FB_CLK from a feedback loop of the phase locked loop. The PFD 110 is responsive to a PLL input reference signal REF_CLK, and a feedback signal FB_CLK which is equivalent to a VCO output PLL_OUT divided by n by divider 150. PFD 110 generates a plurality of out-of-lock indicative signals UP1, DN1, UP0, DN0 corresponding to whether, and to what extent, the feedback signal FB_CLK is phase-locked or out-of-lock with respect to the input reference signal REF_CLK. The phase/frequency detector 110 outputs signals UP1, DN1, UP0, DN0 in response to detecting a phase difference or a frequency difference between the input clock signal REF_CLK and the feedback signal FB_CLK. In the embodiment shown in FIG. 1, the signals UP1, DN1, UP0, DN0 generated by the phase/frequency detector 110 are transmitted to the lock detector 120 via four separate signal paths and to charge pump 130 through two separate signal paths.

The phase-frequency detector 110 receives the reference signal REF_CLK and the feedback signal FB_CLK and generates up signals UP1, UP0 and down signals DN1, DN0 to indicate the phase difference/error between the reference REF_CLK and the feedback FB_CLK signals.

In an embodiment, the up signal UP0 has a pulse width that is proportional to the phase difference between the rising edge of the reference signal REF_CLK and the rising edge of the feedback signal FB_CLK, when the rising edge of the reference signal REF_CLK is the leading edge. The down signal DN0 has a pulse width that is proportional to the phase difference between the rising edge of the feedback signal FB_CLK and the rising edge of the reference signal REF_CLK, when the rising edge of the feedback signal FB_CLK is the leading edge. However, when the rising edge of the reference signal REF_CLK and the feedback signal FB_CLK are aligned, the up signal UP0 and the down signal DN0 do not have a pulse width or have a very short pulse width. Similarly, when the rising edge of the reference signal REF_CLK and the feedback signal FB_CLK are nearly synchronized (or aligned), the up signal UP0, the down signal DN0, or both signals have very short pulse widths.

In a perfect phase-lock, the up and down signal pulses exactly match each other. In practice, however, a "true"

phase-lock is achieved even though there might be slight variations between the corresponding pulses of the up and down signals UP0, DN0. When the pulse width of the up signal is greater than that of the down signal, the phase/frequency detector 110 indicates to the charge pump 130 that an upshifting of the frequency of the phase-locked loop output signal PLL_OUT is required. On the other hand, if the pulse width of the down signal DN0 is greater than that of the up signal UP0, the phase/frequency detector 110 indicates to the charge pump 130 that a downshifting of the output frequency is required to achieve a phase-lock.

In an embodiment, the PFD 110 receives the reference signal REF_CLK and the feedback signal FB_CLK, and generates the up signals UP1, UP0, and the down signals DN1, DN0. These signals are indicative of a phase difference between the input clock signal REF_CLK and the feedback signal FB_CLK. In response to these signals, the lock detector circuit 120 outputs the lock signal PLL_LOCK to indicate whether the PLL is operating in the in-lock mode or in the out-of-lock mode. The lock signal PLL_LOCK is updated each period (or clock cycle) of the reference and feedback signals to indicate the current operating mode of the PLL circuit.

Charge pump 130 is responsive to the UP0 and DN0 signals and is provided for generating a control signal VC whose voltage potential corresponds to a phase error between the feedback signal and the input reference signal, as indicated by the UP0 and DN0 signals. In response to the up signal UP0 and the down signal DN0, the charge pump 130, having a low pass filter, generates a DC voltage VC which is input to the VCO 140.

In an embodiment, the charge pump 130 may comprise a first current source and a second current source. The up signal UP0 activates the first current source, charging Node D, while the down signal DN0 activates a second current source, discharging Node D.

In another embodiment, the charge pump 130 may be a current generator which generates a pump current in response to detecting a difference between the up and down signals UP0, DN0 from the phase/frequency detector 110. Because the pulses of the up and down signals UP0, DN0 may not exactly match due to slight excursions (even though a phase lock is achieved), the charge pump 130 may detect the difference between the up and down signals UP0, DN0 as very narrow pulses. These narrow pulses may cause high frequency jitters in the pump current. The magnitude of the pump current would depend upon the difference between the up and down signals UP0, DN0 and whether the up and down signals UP0, DN0 require an upshifting or a downshifting of the output frequency of PLL_OUT in order to achieve a phase lock. The pump current determines the frequency of the output clock signal PLL_OUT of the phase locked loop.

A loop filter may be coupled to charge pump 130 that amplifies and shapes the transfer characteristic of the control signal VC. A loop filter (not shown as a separate block) is coupled to the charge pump 130 to filter out undesirable noises and jitters in the pump current signal before a control voltage VC is generated.

The loop filter may be either a conventional passive loop filter or an active loop filter known to a person skilled in the art. For example, the loop filter may be a conventional resistor-capacitor (RC) low pass filter that outputs a modified control signal VC having a voltage potential that corresponds to the phase error. In this case, the time constant RC determines the passband of the loop filter. The transfer functions of the loop filter may be designed according to a desired overall response of the phase locked loop.

Oscillator 140, which may be a voltage controlled oscillator 140, is controlled in accordance with the control signal VC generated by the loop filter, and generates the VCO output signal PLL_OUT having a frequency that is proportional to the voltage VC at the VCO input. The VCO output signal PLL_OUT is a phase locked signal at an oscillator frequency which is determined by the loop filter control voltage VC. The VCO 140 may take any one of the plurality of forms well-known in the art. The phase locked loop output PLL_OUT signal may be a digital clock signal having a substantially rectangular waveform or a clipped sinusoidal waveform which approximates a digital signal.

Divider 150 is optionally included in the PLL 100. The divider 150 generates the feedback signal FB_CLK based on the VCO output signal PLL_OUT.

In an embodiment, the divider 150 generates the feedback signal FB_CLK having a frequency that is 1/N times the frequency of the VCO output signal PLL_OUT, in which N can be any value. For example, if the desired frequency of the output clock signal PLL_OUT is multiplied when distributed through a chip to a frequency greater than the frequency of the input clock signal REF_CLK, a feedback frequency divider 150 may be provided within the feedback loop. The feedback frequency divider 150 can have an integer divisor equal to the integer multiple such that the phase/frequency detector 110 is able to compare the frequency of the feedback signal FB_CLK with that of the input clock signal REF_CLK.

In a further embodiment in which the frequency of the phase locked output clock signal PLL_OUT is variably changed when distributed to a chip, the divider 150 may be a programmable frequency divider with a variable divisor, depending upon the relationship of the desired frequency of the output clock signal PLL_OUT with respect to the frequency of the input clock signal REF_CLK. If the frequency of the phase locked output clock signal PLL_OUT is desired to be the same as that of the input clock signal REF_CLK, then no frequency divider need be provided in the feedback loop, and the feedback signal FB_CLK from the VCO 140.

Divider 150 may be implemented, for example, using a simple counter, and increases the frequency of the VCO output reference signal PLL_OUT in accordance with design principles to known to one of ordinary skill in the art.

Lock detector 120 is responsive to the signals UP1, DN1, UP0, DN0. The up and down signals UP0, DN0 produce virtually zero dead zone, while the up and down signals UP1, DN1 produce some dead zone, as will be discussed in detail below with reference to FIG. 5A. The lock detector generates a lock signal PLL_LOCK, which, when active, corresponds to a steady-state lock condition of PLL circuit 100.

The phase lock detector 120 detects a phase lock, and is coupled to receive the up and down signals UP1, UP0, DN1, DN0 from the phase detector 110. The phase lock detector 120 generates a phase lock indicator signal PLL_LOCK. In an embodiment, inputs of phase lock detector 120 are coupled to the up and down signal paths leading from the outputs of the phase/frequency detector 110.

The phase lock detector 120 can determine a difference between the up and down signals from the frequency detector which indicates a phase or frequency variation between the feedback signal FB_CLK and the input clock signal REF_CLK. A phase lock indicator signal PLL_LOCK switches on or to a high level when a true lock condition is achieved. PLL_LOCK high or on is also known as a lock signal. Generation of the lock signal is described below.

The phase lock indicator signal PLL_LOCK generated by the lock detector 120 may be, for example, routed to an output pad. The logical lock signal may be used for a number of purposes that will be understood by those skilled in the art.

Figure 2:
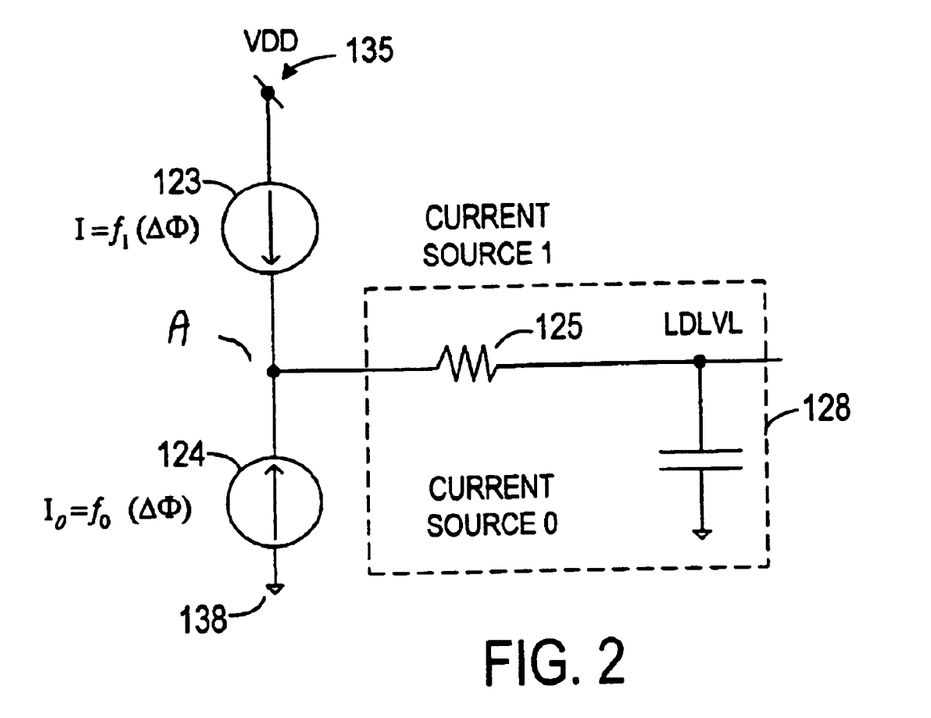
FIG. 2 is an electrical schematic of a converter section of the lock detector.

FIG. 2 is an electrical schematic of a converter section of the lock detector that converts currents that are a function of phase error ($\Delta\Phi$) into a voltage LDLVL via a low pass filter.

The converter section 122 of the lock detector 120 includes current source 123, current source 124, resistor 125 and capacitor 128. Current source 123 is coupled to VDD 135 and produces a current $I_1$ that is a function $f_1$ of phase error ($\Delta\Phi$). Current source 124 is coupled to ground 138 and produces a current $I_0$ that is a different function $f_0$ of phase error ($\Delta\Phi$). Currents $I_0$, $I_1$, are fed to node A that is coupled to low pass filter 142. The currents produced by current source 123 and current source 124 can be utilized to convert the phase error ($\Delta\Phi$) into voltage level LDLVL.

In an embodiment, the low pass filter 142 comprises a resistor 125 and a capacitor 128, with the voltage LDLVL across the capacitor 128 being the output of the filter 142. Resistor 125 is coupled between the current sources and capacitor 128. The frequency response of the filter 142 is characterized by a time constant RC, which is the product of the resistance (R) of the resistor 125 and the capacitance (C) of the capacitor 128. The RC time constant is designed to filter out narrow pulses resulting from small discrepancies between the up and down signals UP1, DN1, UP0, DN0 which are the inputs to converter section 122. Small variations between the up and down signal pulses need be allowed even if the phase locked loop is in a steady-state phase lock. The low pass filter 142 is thus designed with a passband in dependence upon a predetermined threshold pulse width representing a maximum allowable variation between the corresponding edges of the up and down signal pulses, in order to filter out pulses having pulse widths narrower than the threshold pulse width.

The loop filter of FIG. 1 generates the phase locking control voltage VC and therefore needs be highly sensitive to variations in the up and down signal pulses UP0, DN0 generated by the phase/frequency detector 110. Thus, in comparison to the frequency response of the loop filter (not shown) in the phase locked loop of FIG. 1, the filter 142 in the lock detector 120 of FIG. 2 may be designed to filter out pulses that are wider than those which are filtered out by the loop filter (not shown).

Because the lock detector 120 is provided to indicate a steady-state "true" phase lock rather than to closely track the variations in the up and down signals UP0, DN0, the filter 142 in the lock detector 120 may be designed to filter out narrow pulses which would still be passed by the loop filter (not shown) in the phase locked loop of FIG. 1, to allow for some small deviations in the up and down signals UP1, DN1, UP0, DN0.

The passband of the low pass filter 142 in FIG. 2 may thus be narrower than the passband of the loop filter (not shown) in FIG. 1, and the RC time constant of the low pass filter 142 in the lock detector 120 may therefore be greater than that of the loop filter (not shown).

The voltage LDLVL is output at the node coupling the resistor 125 to capacitor 128. The voltage LDLVL that is generated by the converter section shown in FIG. 2 is then supplied to a lock signal generator section such as those shown in FIG. 3A or FIG. 3B.

Figure 3A:
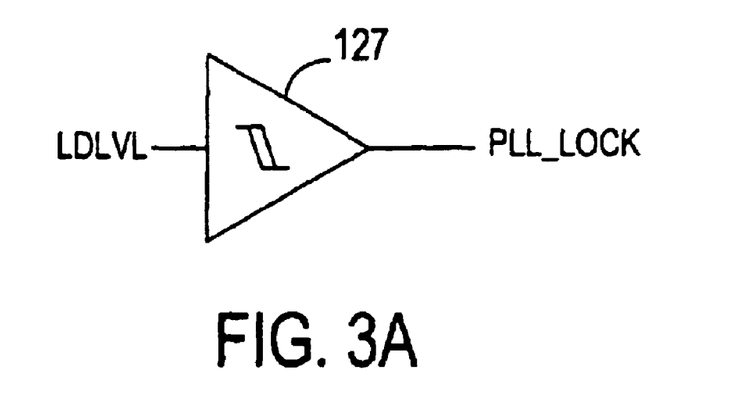
FIG. 3A is an electrical schematic of a lock signal generator section of the lock detector.

FIG. 3A is an electrical schematic of a lock signal generator circuit section of the lock detector that comprises a hysteresis driver that senses voltage LDLVL and generates an output signal of lock detector PLL_LOCK.

In FIG. 3A a hysteresis driver 127 is provided that receives a voltage LDLVL and provides the output signal of the lock detector PLL_LOCK.

In an embodiment, the output of the low pass filter 142 is coupled to an inverter 127, such as a Schmitt trigger, with hysteresis characterized by the voltage LDLVL. When LDLVL is input into the Schmitt trigger, the Schmitt trigger is capable of generating the phase lock indicator signal PLL_LOCK. The PLL_LOCK output is in a high state to indicate a true phase lock or a low state otherwise.

Figure 3B:
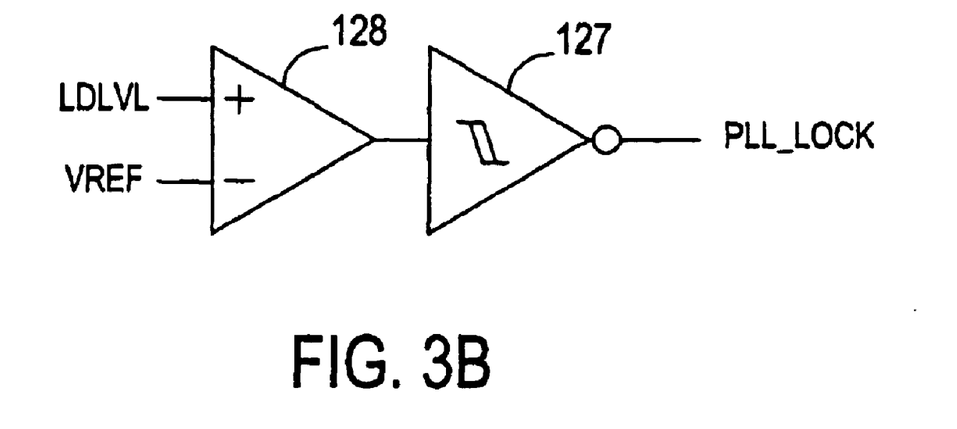
FIG. 3B is an electrical schematic of another embodiment of a lock signal generator section of the lock detector.

FIG. 3B is an electrical schematic of another embodiment of a lock signal generator section of the lock detector that comprises an operational amplifier and hysteresis driver that senses voltage LDLVL and generates an output signal of lock detector PLL_LOCK.

In an embodiment, the lock signal generator section additionally includes an operational amplifier 128 that receives the voltage LDLVL at the non-inverting terminal and a voltage reference signal Vref at the non-inverting terminal. Sensitivity of lock detector can be changed by inputting various reference voltages into the operational amplifier.

In a typical phase locked loop operation, small variations between the up and down signals are sometimes present even when the phase-locked loop is in a steady-state phase lock. As such, the phase lock detector 120 is designed to allow for some small variations in the up and down signals generated by the phase/frequency detector 110 while indicating a true steady-state phase lock.

The threshold variation may be designed in the lock detector 120 such that it outputs the lock indicator signal PLL_LOCK to signify a "true" phase lock when the variation between the up and down signals is within the threshold, even though the up and down signal pulses are not perfectly matched. The operational amplifier generates an output signal that is then input into a hysteresis driver 127. The hysteresis driver 127 then generates the output signal PLL_LOCK of the lock detector. When the voltage which is inputted into the driver has a small swing in the vicinity of the threshold, the hysteresis driver 127 helps to prevent a glitch pulse from appearing in the phase lock indicator signal PLL_LOCK. Without hysteresis, a glitch pulse is more likely to appear in the phase lock indicator signal PLL_LOCK.

Figure 4A:
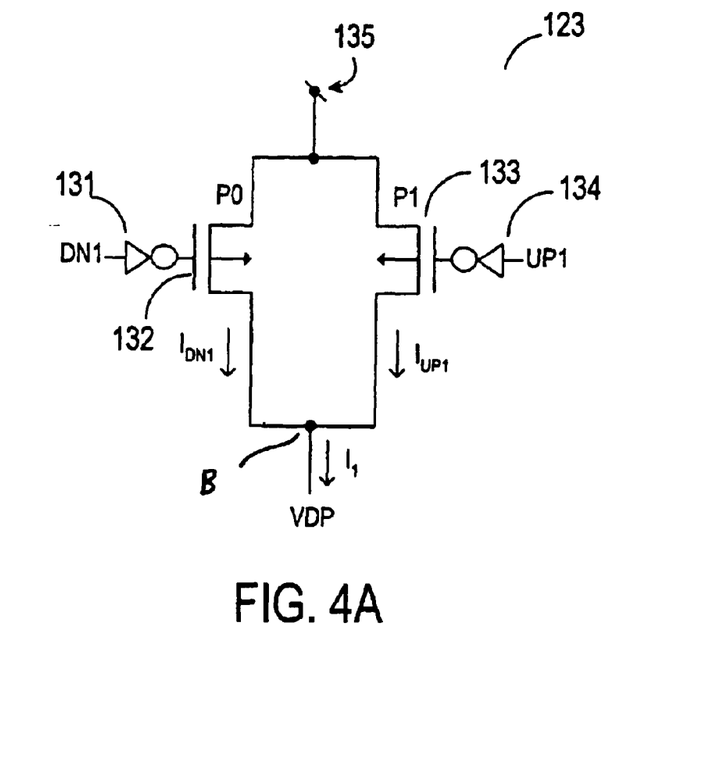
FIG. 4A is an electrical schematic of an embodiment of current source 1 from FIG. 2.

FIG. 4A is an electrical schematic of an embodiment of current source 1 from FIG. 2 which generates $I_1$, in response to control signals DN1, UP1.

Current source 123 includes inverters 131, 134, a pair of p-channel MOSFETs 132 and 133 coupled in parallel between VDD 135 and an output node B. Down signal DN1 is input into inverter 131, and the output of inverter 131 is then coupled to the gate of transistor 132. DN1 biases the gate allowing a current $I_{DN1}$ to flow between the source/drain and drain/source of transistor 132. In a similar manner, up signal UP1 is inverted by inverter 134 and the inverted UP1 signal is input into the gate of transistor 133, biasing the transistor 133 and causing current $I_{UP1}$ to flow from the drain/source to the source/drain of transistor $I_{UP1}$. The currents $I_{DN1}$ and $I_{UP1}$ then both flow into node B to generate $I_1$.

Figure 4B:
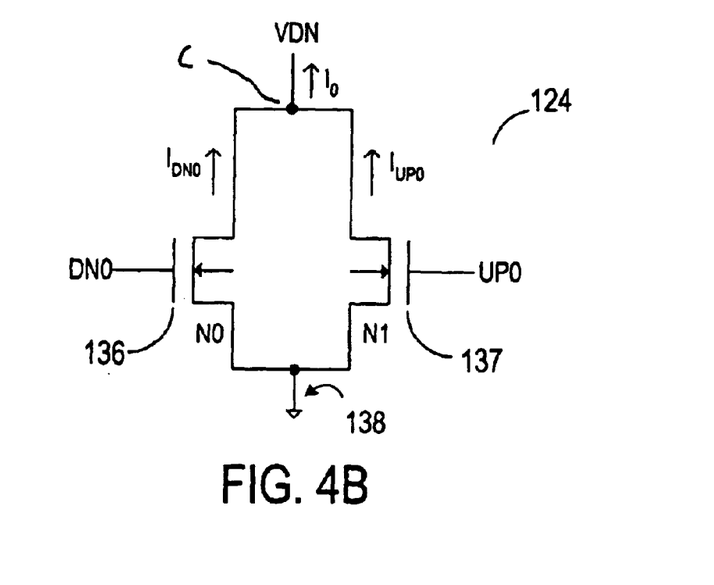
FIG. 4B is an electrical schematic of an embodiment of current source 2 from FIG. 2.

FIG. 4B is an electrical schematic of an embodiment of current source 124 of FIG. 2 which generates $I_0$ in response to control signals DN0, UP0.

Current source 124 includes a pair of n-channel MOSFET transistors 136 and 137 coupled in parallel between ground 138 and node C. As shown in FIG. 4B, the down signal DN0 biases the gate of transistor 136 causing the current $I_{DN0}$ to flow between the drain/source and source/drain of transistor 136. In a similar manner, the up signal UP0 is input at the gate of transistor 137 biasing that transistor and causing a current $I_{UP0}$ to flow between the drain/source and the source/drain of transistor 137. Currents $I_{DN0}$ and $I_{UP0}$ then combine at node C to generate current $I_0$.

The currents $I_{DN1}$, $I_{UP1}$, $I_{DN0}$, $I_{UP0}$, $I_0$ and $I_1$, and the charges $Q_{DN1}$, $Q_{UP1}$, $Q_{DN0}$, $Q_{UP0}$, $Q_0$ and $Q_1$ are governed by the equations shown below as equations 1–6, respectively.

$$Q_{DN1} = \int_0^T I_{DN1} dt \not\subset \int_0^T g_{m\_P0}(t) * V_{DN1}(t) dt \quad (1)$$

$$Q_{UP1} = \int_0^T I_{UP1} dt \not\subset \int_0^T g_{m\_P1}(t) * V_{UP1}(t) dt \quad (2)$$

$$Q_{DN0} = \int_0^T I_{DN0} dt \not\subset \int_0^T g_{m\_N0}(t) * V_{DN0}(t) dt \quad (3)$$

$$Q_{UP0} = \int_0^T I_{UP0} dt \not\subset \int_0^T g_{m\_N1}(t) * V_{UP0}(t) dt \quad (4)$$

$$I_0 = I_{DN0} + I_{UP0}(Q_0 = Q_{DN0} + Q_{UP0}) \quad (5)$$

$$I_1 = I_{DN1} + I_{UP1}(Q_1 = Q_{DN1} + Q_{UP1}) \quad (6)$$

As shown in Equation (1), $I_{DN1}$ depends on the mutual transconductance of transistor (P0) 132 and $V_{DN1}$. Similarly, as shown in Equations (2)–(4), currents $I_{UP1}$, $I_{DN0}$, and $I_{UP0}$ depend on the mutual transconductance of transistors (P1) 133, (N0) 136, and (N1) 137, respectively, and $V_{UP1}$, $V_{DN0}$, and $V_{UP0}$, respectively. T is the cycle tine of the PLL input reference signal REF_CLK.

Figure 5A:
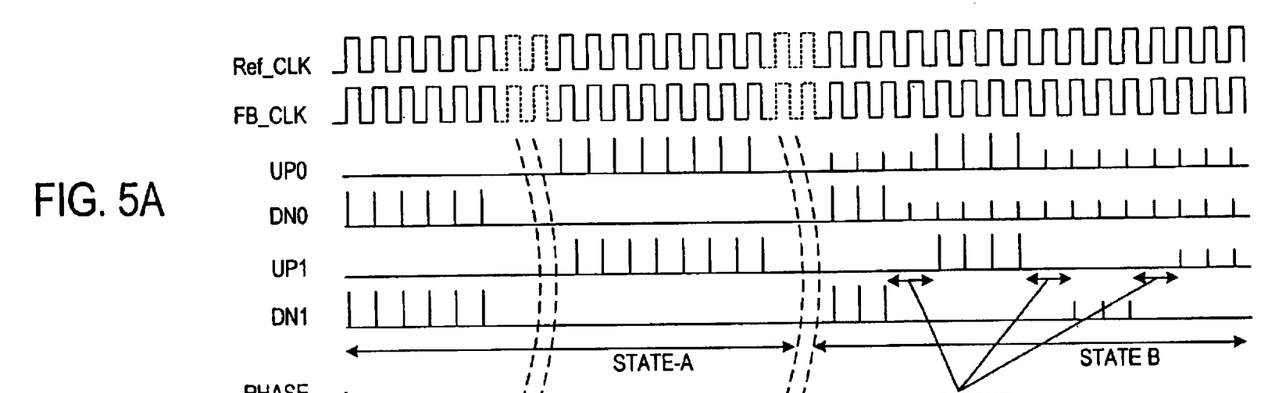
FIGS. 5A through 5E is a timing diagram that shows the relationship between timing of PLL input reference signal REF_CLK, feedback signal FB_CLK, up signal UP0, down signal DN0, up signal UP1, down signal DN1, phase error PHASE_ERROR, currents I1 and I0, a voltage LDLVL, reference signal Vref, and output signal of lock detector PLL_LOCK.
Figures 5B, 5C:
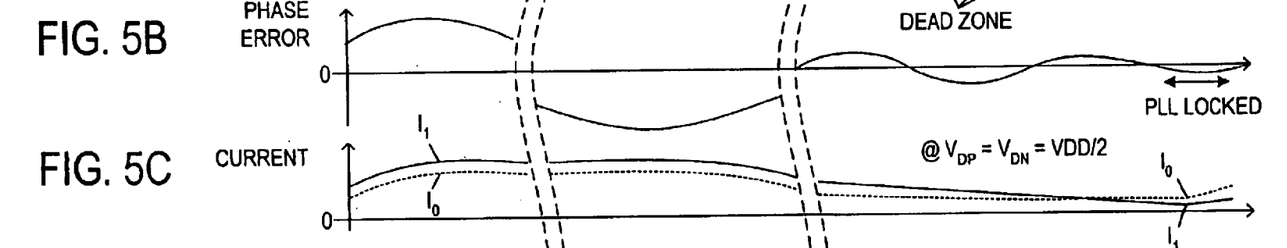

UP0, DN1, UP1, DN1 are all shown in FIG. 5A. As shown in FIGS. 5A and 5B, when phase error ($\Delta\Phi$) is positive, DN0 and DN1 are full on or full high and UP0 and UP1 are off or low. Conversely, when phase error ($\Delta\Phi$) is negative, DN0 and DN1 are off or low and UP0 and UP1 are full on or high. Thus, because $V_{DN1}$ depends on the phase error ($\Delta\Phi$) it follows that $Q_{DN1}$ also is dependent upon phase error ($\Delta\Phi$). $Q_{UP1}$, $Q_{DN0}$ and $Q_{UP0}$ each depend on phase error ($\Delta\Phi$) in a similar manner. Thus, as shown in Equations (5) and (6), charges $Q_0$ (which is the sum of $Q_{DN0}$ and $Q_{UP0}$) and $Q_1$, (which is the sum of $Q_{DN1}$ and $Q_{UP1}$) both also depend upon phase error.

The relationship between the mutual transconductance $g_m$ of transistors (P0) 132, (P1) 133, (N0) 136 and (N1) 137 is expressed below in equation 7.

$$g_{m\_P0} = g_{m\_P1} > g_{m\_N0} = g_{m\_N1} \quad (7)$$

As shown in equation 7, the mutual transconductance of transistor (P0) 132 is the same as that of transistor (P1) 133 and the mutual of transconductance of transistor (NO) 136 is the same as that of transistor (N1) 137. In addition, the mutual of transconductance of transistors (P0) 132 and (P1) 133 is greater than that of transistors (NO) 136 and (N1) 137.

Figure 4C:
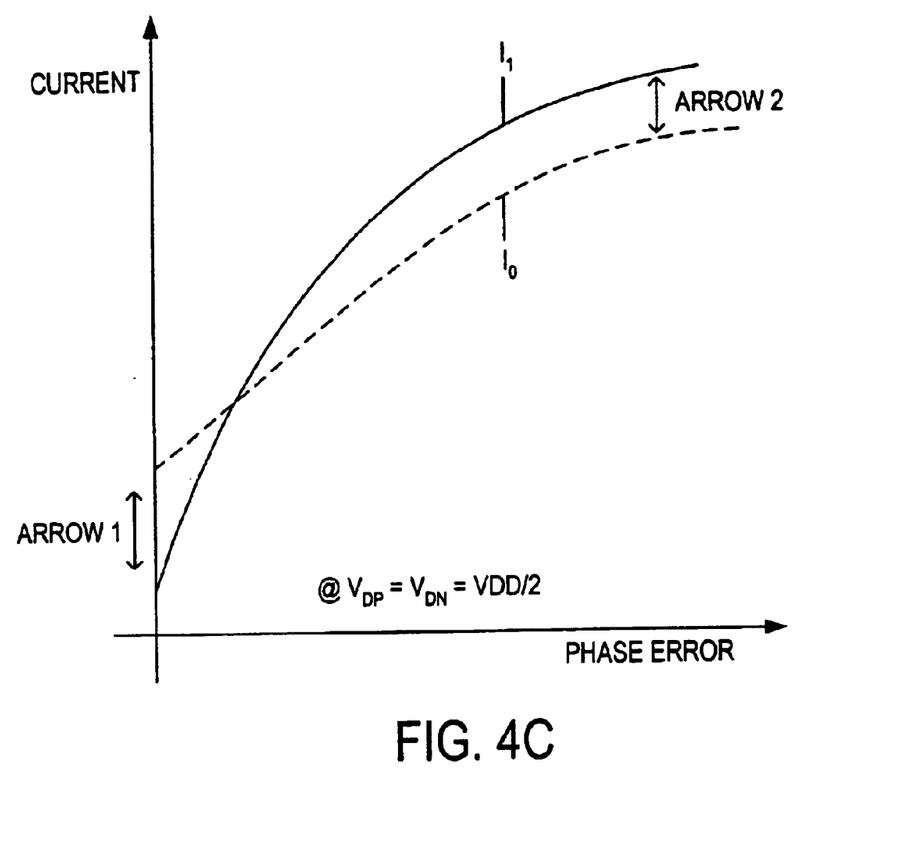
FIG. 4C is a graph of currents $I_0$ and $I_1$ as a function of phase error.

FIG. 4C is a graph of charges $Q_0$ and $Q_1$ as a function of phase error ($\Delta\Phi$).

Arrow 1 illustrates the difference between $Q_0$ and $Q_1$ due to the difference of "dead zone" range of the UP1, DN1 signals, and of the UP0, DN0 signals as phase error ($\Delta\Phi$) increases. When the phase error ($\Delta\Phi$) is small, charge $Q_1$ can become smaller than $Q_0$ due to a dead zone during which the up signal UP1 and the down signal DN1 are both off. When phase error is relatively large, the signals UP0, DN0, and UP1, DN1 are alternately on and off. When the phase error ($\Delta\Phi$) is relatively large, $Q_1$ is bigger than $Q_0$ assuming that $V_{DP}$ approximately equals $V_{DN}$ which approximately equals VDD/2.

Arrow 2 illustrates the difference between $Q_1$ and $Q_0$. As will be discussed below, the difference these charges is caused by a difference in the mutual transconductance of the transistors 132, 133 used in current source 123 and the transistors 136, 137 used in current source 124. When phase error ($\Delta\Phi$) increases to a relatively high value, the signals UP0, DN0, and UP1, DN1 are alternately on and off as the PLL 100 attempts to lock by decreasing the value of the phase error.

FIGS. 5A through 5E are timing diagrams.

FIG. 5A shows the relationship between timing of PLL input reference signal REF_CLK, feedback signal FB_CLK, up signal UP0, down signal DN0, up signal UP1, and down signal DN1.

FIG. 5A is divided into two distinct states, a first state (state A) and a second state (state B).

In state A, phase error is relatively large, and in state B phase error is relatively small. During the second state B, the signals UP1, DN1, and UP0, DN0 may have either a first discrete value (e.g., 0), a second discrete value (e.g., 0.5) or a third discrete value (e.g., 1).

State A

During the first state (A), the first up signal UP1, first down signal DN1, second up signal UP0, and second down signal DN0 may have either a first discrete value (e.g., 0) or a third discrete value (e.g., 1). In an embodiment, signals UP0, UP1 are "off" during state A when phase error is positive and are "full on" when phase error is negative. Conversely, signals DN0, DN1 are "full on" when phase error is positive and are "off" when phase error is negative. Thus, in state A, the signals DN0 and DN1 are almost identical, and the signals UP0 and UP1 are also almost identical. Moreover, DN0 and DN1 are opposite the signals UP0 and UP1 so that when DN0 and DN1 are both off or low, the signals UP0 and UP1 are both full on or high. Conversely, when DN0 and DN1 are both full on or high, the signals UP0 and UP1 are both full low or off.

FIG. 5B shows phase error ($\Delta\Phi$) PHASE_ERROR. In state A the phase error ($\Delta\Phi$) is relatively large, and as shown in FIGS. 5A and 5B, the first up signal UP1 is almost equal to the second up signal UP0. In an embodiment, when phase error ($\Delta\Phi$) is positive, DN0 and DN1 are full on or full high and UP0 and UP1 are off or low. In this embodiment, the first up signal UP1 and the second up signal UP0 have the third discrete value when phase error is negative, while the first down signal DN1, which is almost equal to the second down signal DN0, is at the first discrete value when phase error is negative.

Conversely, when phase error ($\Delta\Phi$) is positive, DN0 and DN1 are full on or high and UP0 and UP1 are off or low. Thus, the first up signal UP1 and the second up signal UP0 have the first discrete value when phase error is positive. The first down signal DN1, which is equal to the second down signal DN0, has the third discrete value when phase error is positive.

FIG. 5C shows charges Q1 and Q0. As shown in FIG. 5C, if $V_{DP}$ and $V_{DN}$ both equal approximately VDD/2, this means that $Q_1$ will be greater than $Q_0$. When UP1 and DN1 are "on", $Q_1$ is greater than $Q_0$ due to the difference in the mutual transconductance of transistors (P0) 132 and (P1) 133 in comparison to the mutual transconductance of transistors (N0) 136 and (N1) 137.

Figure 5D:
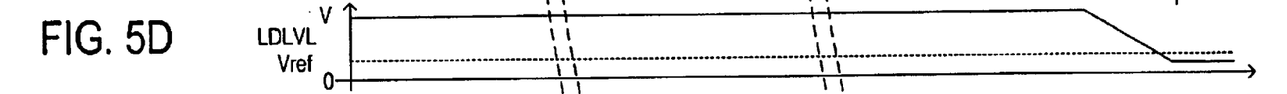

FIG. 5D shows the voltage LDLVL with respect to reference signal Vref. During state A, the voltage LDLVL is at VDD.

State B

During the second state (B), the first up signal UP1, first down signal DN1, have either the first discrete value (e.g., 0), the second discrete value (e.g., 0.5) or a third discrete value (e.g., 1), while the second up signal UP0, and second down signal DN0 have either the second discrete value (0.5) or a third discrete value (1) relative to phase error.

In an embodiment, the signals UP0 and DN0 are both always full on or half on, while the signals UP1 and DN1 are never on simultaneously.

The first up signal UP1, which is almost equal to the second up signal UP0 when phase error is negative, has either the second discrete value or the third discrete value when phase error is negative. In an embodiment, the signal UP1 is "off" when phase error is positive (or is transitioning from positive-to-negative or vice-versa) and is either full on or partly on when phase error is negative.

Conversely, the first down signal DN1, which is almost equal to the second down signal DN0 when phase error is positive, has either the second discrete value or the third discrete value when phase error is positive. In an embodiment, signal DN1 is either "full on" or partly on when phase error is positive and is "off" when phase error is negative (or is transitioning from positive-to-negative or vice-versa). Thus, UP1 and DN1 are alternately on and off during state B such that when UP1 is full on or partly on, DN1 is off, and when DN1 is full on or partly on, UP1 is off.

The periods when UP1 and DN1 are both off define a "dead zone," as shown in FIG. 5A by the two headed arrows. The dead zone occurs when the phase error signal is transitioning from positive to negative or negative to positive. The dead zone causes $Q_1$ to fall below $Q_0$ since during a "dead zone" both UP1 and DN1 are off and therefore Q1 eventually decreases below $Q_0$. As shown in FIG. 5B, in state B, the phase error ($\Delta\Phi$) becomes small and decreasingly oscillates towards zero. The PLL becomes locked when the phase error reaches a sufficiently small, stable value approaching zero.

As shown in FIG. 5C, as the phase error ($\Delta\Phi$) becomes smaller when $V_{DP}$ and $V_{DN}$ are substantially equal to VDD/2, the charges $Q_1$ and $Q_0$ become increasingly closer in magnitude until $Q_0$ becomes greater than $Q_1$. $Q_0$ becomes greater than $Q_1$ due to the dead zone that occurs when both UP1 and DN1 are off during state B. This causes $Q_1$ to decrease in magnitude more rapidly than the rate at which $Q_0$ decreases over this interval since the currents $I_{DN1}$, $I_{UP1}$, are less than the currents $I_{DN0}$, $I_{UP0}$.

When $Q_0$ becomes greater than $Q_1$, as shown in FIG. 5D, this triggers the voltage LDLVL to transition from VDD towards ground. The voltage LDLVL goes towards to ground since $Q_1$ is smaller than $Q_0$.

Figure 5E:
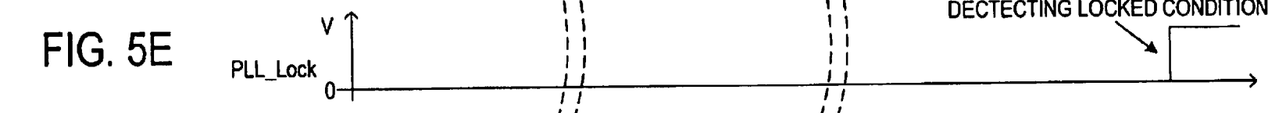

FIG. 5E shows output signal of lock detector PLL_LOCK. When the voltage LDLVL drops below the reference voltage Vref, the output signal of the lock detector PLL_LOCK changes to VDD, which means that a lock condition has been detected. The lock signal is generated when the second up signal UP0 and the second down signal DN0 have both reached the second discrete value (0.5) and the second down signal DN0 is greater than the first down signal DN1 and the second up signal UP0 is greater than the first up signal UPI thereby causing the capacitor 128 to discharge.

Figure 6A:
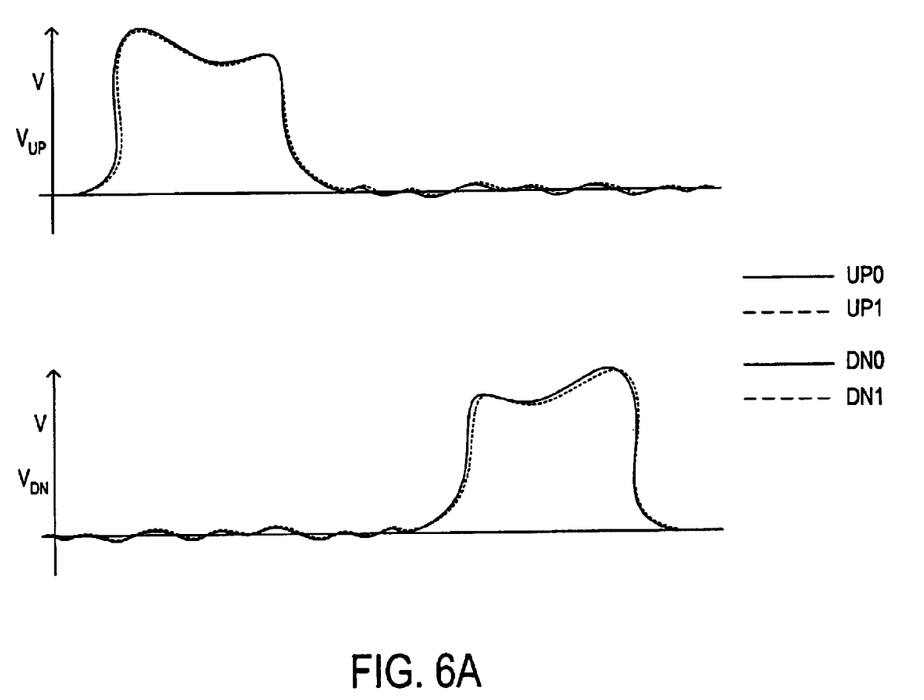
FIG. 6A are graphs of $V_{UP}$ and $V_{DN}$ when the lock detector is operating in state A.

FIG. 6A are graphs of $V_{UP}$ and $V_{DN}$ when the lock detector is operating in state A. In the upper graph of $V_{UP}$, the solid line represents UP0 and the dashed line represents UP1. In the lower graph of $V_{DN}$, the solid line represents DN0 and the dashed line represents DN1. As shown in FIG. 6A, in state A, UP0 and UP1 are substantially equal DN0 and DN1 are also substantially equal.

Figure 6B:
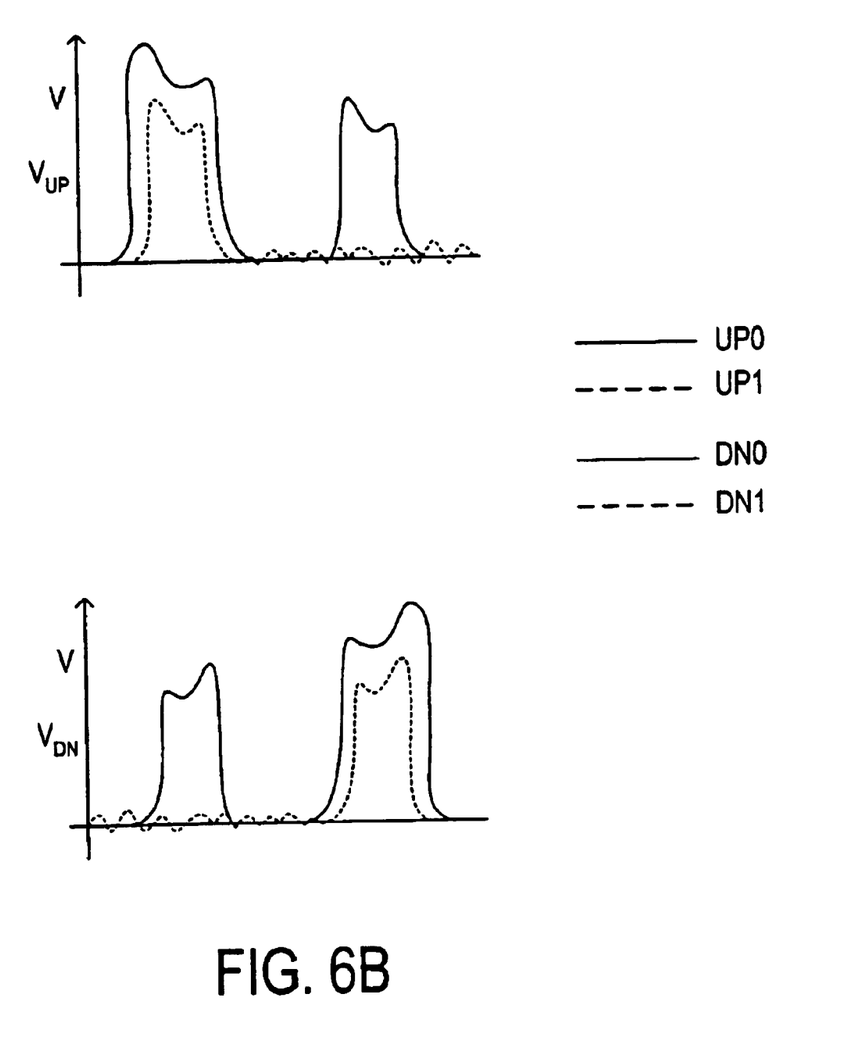
FIG. 6B are graphs of $V_{UP}$ and $V_{DN}$ when the lock detector is operating in state B.

FIG. 6B are graphs of $V_{UP}$ and $V_{DN}$ when the lock detector is operating in state B. In the upper graph of $V_{UP}$, the solid line represents UP0 and the dashed line represents UP1, whereas in the lower graph of $V_{DN}$, the solid line represents DN0 and the dashed line represents DN1. As shown in FIG. 6B, during state B UP0 and UP1 are significantly different at certain times, while DN0 and DN1 are also different at times.

Figure 7:
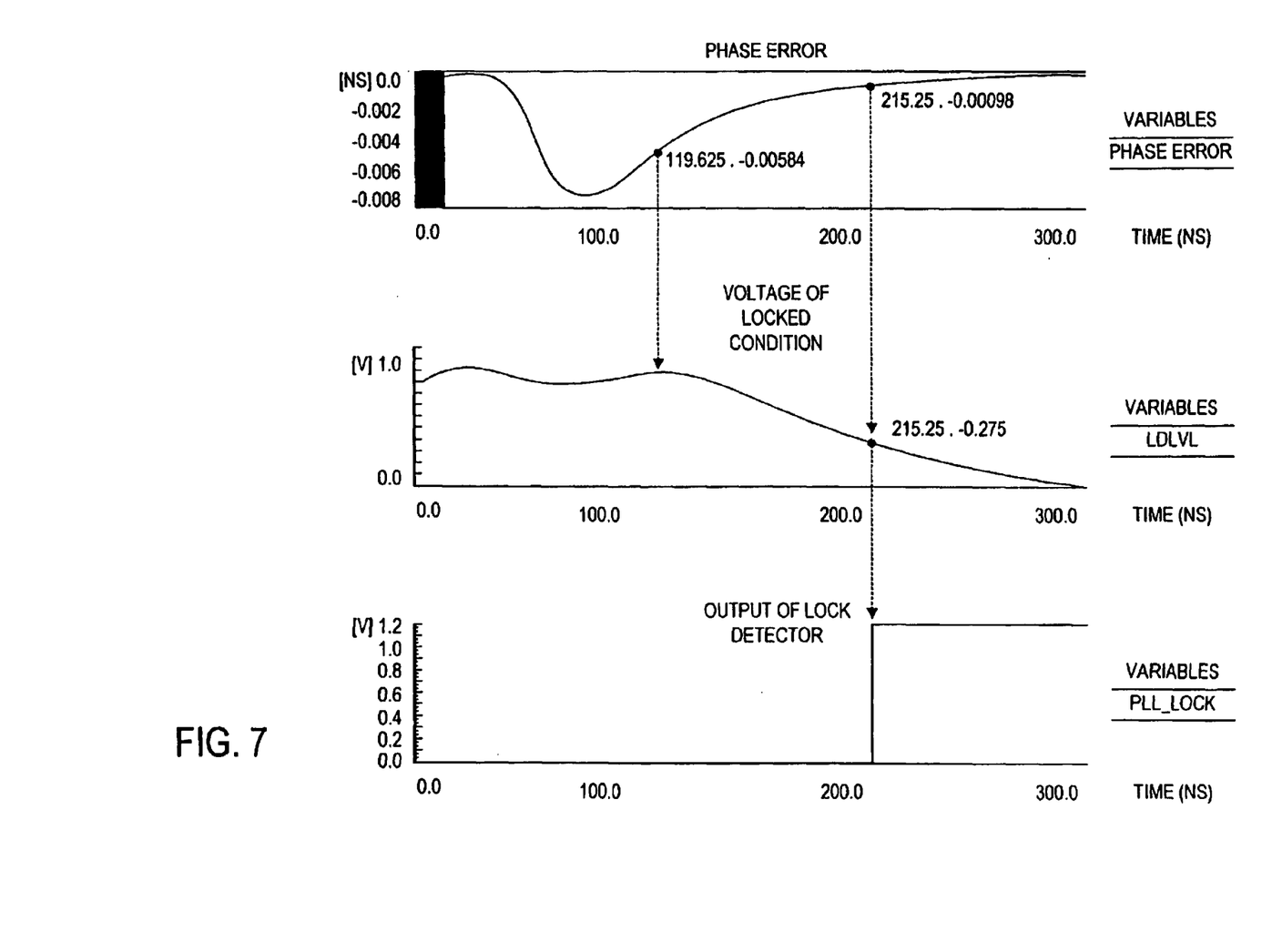
FIG. 7 are graphs from a simulation of the phase-locked loop shown in FIG. 1.

FIG. 7 includes graphs from a simulation of the phase-locked loop shown in FIG. 1. The graphs in FIG. 7 illustrate phase error ($\Delta\Phi$) PHASE_ERROR as a function of time, a voltage LDLVL as a function of time, and output signal of lock detector PLL_LOCK as a function of time during frequency and phase acquisition.

The simulation results demonstrate that when phase error ($\Delta\Phi$) is under 5 picoseconds, the voltage LDLVL shown in the middle graph decreases. The output of the lock detector PLL-LOCK changes to VDD when the phase error ($\Delta\Phi$) is under 2 picoseconds, which reflects that a locked condition has been detected (i.e., a lock signal is generated).

It is to be understood that the above description is intended to be illustrative, and not restrictive. Many other embodiments will be apparent to those of skill in the art upon reading and understanding the above description. For example, in an embodiment if a different phase locked output clock signal PLL_OUT is desired, an output frequency divider (not shown) may be coupled to the voltage controlled oscillator 140 to divide the oscillator frequency by a predetermined divisor to generate the phase locked output clock signal PLL_OUT at the desired output frequency. An output frequency divider could be provided to divide the oscillator frequency by two to generate a phase locked output digital clock signal PLL_OUT with a duty cycle of 50%. As such, the scope of the invention should be determined with reference to the appended claims, along with the full scope of equivalents to which such claims are entitled.

What is claimed is:

1. A lock detector, comprising:
   a converter unit that generates a voltage based on a first difference and a second difference,
   wherein the first difference is based on a first up signal and a first down signal, and
   wherein the second difference is based on a second up and a second down signal; and
   a lock signal generator that generates a lock signal based on the voltage wherein the first signal and the second signal are formed on different lines and the first down signal and the second down signal are formed on different lines.

2. A lock detector according to claim 1,
   wherein the first difference is a first function of phase error and the second difference is a second function of phase error, and
   wherein the converter unit coverts phase error to a voltage based on the first difference and the second difference.

3. A lock detector according to claim 2,
   wherein the voltage decreases when the first difference is greater than the second difference, and
   wherein the lock signal generator generates the lock signal when the voltage becomes less than a reference voltage.

4. A lock detector according to claim 2, wherein the first difference corresponds to a first current and the second difference is corresponds to a second current, and wherein the converter unit comprises:
   a first current source that generates the first current in response to at least one of the first up signal and the first down signal;

a second current source that generates the second current in response to at least one of the second up signal and the second down signal; and a filter, responsive to one of the first and second currents, that generates the voltage.

5. A lock detector according to claim 3, wherein the first current generates a first charge and the second current generates a second charge, and wherein the voltage is based on the first charge and the second charge.

6. A lock detector according to claim 3, wherein the first current source comprises:

a first difference amplifier that generates a first down current and a first up current in response to the first up signal and the first down signal, respectively, wherein the first current is based on a first down current and a first up current.

7. A lock detector according to claim 3, wherein the second current source comprises:

a second difference amplifier that generates a second down current and a second up current in response to the second up signal and the second down signal, respectively, wherein the second current is based on a second down current and a second up current.

8. A lock detector according to claim 6, wherein the first difference amplifier, comprises:

a first transistor of a first conductivity type that provides the first down current in response to the first down signal; and a second transistor of the first conductivity type that provides the first up current in response to the first up signal, wherein the first and second transistors each have a first transconductance that is substantially equal.

9. A lock detector according to claim 7, wherein the second difference amplifier, comprises:

a third transistor of a second conductivity type that provides the second down current in response to the second down signal; and a fourth transistor of the second conductivity type that provides the second up current in response to the second up signal, wherein the third and fourth transistors each have a second transconductance that is substantially equal, wherein the second transconductance is less than the first transconductance.

10. A lock detector according to claim 5, wherein the lock detector is operable in a first state and a second state, and wherein a magnitude of the phase error is above a value in a first state and below the value in a second state.

11. A lock detector according to claim 10, wherein the first up signal UP1 is off when phase error is positive and wherein the first down signal is off when phase error is negative, and wherein the second up signal and second down signal are on during the second state.

12. A lock detector according to claim 11, wherein the first up signal and the first down signal are characterized by a dead zone in the second state during which the first up signal and the first down signal are both off, when phase error is transitioning from a positive value to a negative value or from the negative value to the positive value.

13. A lock detector according to claim 11, wherein the lock signal is generated in the second state when the voltage is less than the reference voltage and the second down signal is greater than the first down signal and the second up signal is greater than the first up signal.

14. A lock detector according to claim 5, wherein the voltage decreases from a positive supply voltage to the reference voltage when the first charge is smaller than the second charge.

15. A lock detector according to claim 14, wherein the lock signal is a lock voltage substantially equal to the positive supply voltage.

16. A lock detector according to claim 15, wherein the first charge is less than the second charge when the lock signal is generated.

17. A lock detector according to claim 11, wherein the lock signal is generated when the phase error is less than 2 picoseconds.

18. A lock detector according to claim 2, wherein the means for sensing, comprises:

a hysteresis driver, responsive to the voltage, that generates the lock signal.

19. A lock detector according to claim 2, wherein the means for sensing, comprises:

an amplifier, responsive to the voltage and the reference voltage, that generates an amplifier output; and a Schmitt trigger that generates the lock signal when the voltage is less than the amplifier output.

20. A phase lock loop, comprising:

a phase/frequency detector, responsive to an input clock signal and a feedback signal, that generates a first up signal, a first down signal, a second up signal, and a second down signal; and a lock detector, comprising:

a converter unit that generates a voltage based on a first difference and a second difference, wherein the first difference is based on the first up signal and the first down signal, and wherein the second difference is based on the second up and the second down signal; and a lock signal generator that generates a lock signal based on the voltage wherein the first signal and the second signal are formed on different lines and the first down signal and the second down signal are formed on different lines.

21. A phase locked loop according to claim 20, wherein the first difference is a first function of phase error and the second difference is a second function of phase error, and wherein the converter unit coverts phase error to a voltage based on the first difference and the second difference.

22. A phase locked loop according to claim 21, wherein the voltage decreases when the first difference is greater than the second difference, and wherein the lock signal generator generates the lock signal when the voltage becomes less than a reference voltage.

23. A phase locked loop according to claim 22, wherein the first difference corresponds to a first current and the second difference is corresponds to a second current, and wherein the converter unit comprises:

a first current source that generates the first current in response to at least one of the first up signal and the first down signal;

a second current source that generates the second current in response to at least one of the second up signal and the second down signal; and a filter, responsive to one of the first and second currents, that generates the voltage.

24. A phase locked loop according to claim 23, wherein the first current generates a first charge and the second current generates a second charge, and wherein the voltage is based on the first charge and the second charge.

25. A phase locked loop according to claim 23, wherein the first current source comprises:
a first difference amplifier that generates a first down current and a first up current in response to the first up signal and the first down signal, respectively, wherein the first current is based on a first down current and a first up current.

26. A phase locked loop according to claim 23, wherein the second current source comprises:
a second difference amplifier that generates a second down current and a second up current in response to the second up signal and the second down signal, respectively, wherein the second current is based on a second down current and a second up current.

27. A phase locked loop according to claim 26, wherein the first difference amplifier, comprises:
a first transistor of a first conductivity type that provides the first down current in response to the first down signal; and
a second transistor of the first conductivity type that provides the first up current in response to the first up signal,
wherein the first and second transistors each have a first transconductance that is substantially equal.

28. A phase locked loop according to claim 27, wherein the second difference amplifier, comprises:
a third transistor of a second conductivity type that provides the second down current in response to the second down signal; and
a fourth transistor of the second conductivity type that provides the second up current in response to the second up signal,
wherein the third and fourth transistors each have a second transconductance that is substantially equal, wherein the second transconductance is less than the first transconductance.

29. A phase locked loop according to claim 25, wherein the phase locked loop is operable in a first state and a second state, and wherein a magnitude of the phase error is above a value in a first state and below the value in a second state.

30. A phase locked loop according to claim 25, wherein the first up signal UP1 is off when phase error is positive and wherein the first down signal is off when phase error is negative, and wherein the second up signal and second down signal are on during the second state.

31. A phase locked loop according to claim 30, wherein the first up signal UP1 and the first down signal DN1 are characterized by a dead zone in the second state during which the first up signal and the first down signal are both off, when phase error is transitioning from a positive value to a negative value or from the negative value to the positive value.

32. A phase locked loop according to claim 31, wherein the lock signal is generated in the second state when the voltage is less than the reference voltage and the second down signal is greater than the first down signal and the second up signal is greater than the first up signal.

33. A phase locked loop according to claim 24, wherein the voltage decreases from a positive supply voltage to the reference voltage when the first current is smaller than the second current.

34. A phase locked loop according to claim 32, wherein the lock signal is a lock voltage substantially equal to the positive supply voltage.

35. A phase locked loop according to claim 32, wherein the first charge is less than the second charge when the lock signal is generated.

36. A phase locked loop according to claim 31, wherein the lock signal is generated when the phase error is less than 2 picoseconds.

37. A phase locked loop according to claim 22, wherein the means for sensing, comprises:
a hysteresis driver, responsive to the voltage, that generates the lock signal.

38. A phase locked loop according to claim 22, wherein the means for sensing, comprises:
an amplifier, responsive to the voltage and the reference voltage, that generates an amplifier output; and
a Schmitt trigger that generates the lock signal when the voltage is less than the amplifier output.

39. The phase locked loop of claim 21, further comprising:
a charge pump, coupled to the phase/frequency detector, capable of generating a pump current in response to the second up signal and the second down signal;
an oscillator, coupled to the charge pump, capable of generating an oscillator output signal at an oscillator frequency in response to the pump current; and
a loop filter, coupled between the charge pump and the oscillator, capable of filtering the pump current to generate a voltage for the oscillator.

40. The phase locked loop of claim 21, further comprising:
a divider, coupled to the oscillator, that divides the phase locked output signal to generate the feedback signal.

41. A method of detecting a locked condition in a phase locked loop, comprising:
generating a first up signal, a first down signal, a second up signal, and a second down signal;
generating a first difference based on the first up and first down signals and a second difference based on the second up and second down signals;
generating a voltage based on the first difference and the second difference, wherein the voltage decreases when the first difference is greater than the second difference and wherein the first signal and the second signal are formed on different lines and the first down signal and the second down signal are formed on different lines.

42. A method according to claim 41, further comprising:
sensing when the voltage becomes less than a reference voltage; and
generating a lock signal when the voltage becomes less than a reference voltage.

43. A method according to claim 42, wherein the generating a voltage based on the first difference and the second difference, comprises:
generating a first current that corresponds to the first difference in response to at least one of the first up signal and the first down signal;
generating a second current that corresponds to the second difference in response to at least one of the second up signal and the second down signal; and
filtering at least one of the first and second currents to generate the voltage.

44. A method according to claim 43, wherein the first current is a first function of phase error and generates a first voltage.

45. A method according to claim 44, wherein the second current is a second function of the phase error and generates a second voltage, wherein the first voltage and the second voltage are used generate the voltage.

46. A method according to claim 45, wherein the first current is based on a first down current and a first up current that are generated in response to the first up signal and the first down signal, respectively.

47. A method according to claim 45, wherein the second current is based on a second down current and a second up current that are generated in response to the second up signal and the second down signal, respectively.

48. A method according to claim 46, wherein a magnitude of phase error is above a value in a first state and below the value in a second state.

49. A method according to claim 48, wherein the first up signal is off when phase error is positive and wherein the first down signal is off when phase error is negative, and wherein the second up signal and second down signal are on during the second state.

50. A method according to claim 49, wherein the first up signal and the first down signal are characterized by a dead zone in the second state during which the first up signal and the first down signal are both off, when phase error is transitioning from a positive value to a negative value or from the negative value to the positive value.

51. A method according to claim 50, wherein the lock signal is generated in the second state when the voltage is less than the reference voltage and the second down signal is greater than the first down signal and the second up signal is greater than the first up signal.

52. A method according to claim 51, wherein the voltage decreases from a positive supply voltage to the reference voltage when the first current is smaller than the second current.

53. A method according to claim 52, wherein the lock signal is a lock voltage substantially equal to the positive supply voltage.

54. A method according to claim 53, wherein the first current is less than the second current when the lock signal is generated.

55. A method according to claim 50, wherein the lock signal is generated when the phase error is less than 2 picoseconds.

56. A method according to claim 43, wherein the first difference is a first function of phase error and the second difference is a second function of phase error, and wherein generating a voltage based on the first difference and the second difference, comprises:

converting phase error into the voltage.

57. A method according to claim 44, wherein sensing, comprises:

amplifying the voltage and the reference voltage to generate an amplifier output; and generating the lock signal when the voltage is less than the amplifier output.

58. The method of claim 43, further comprising:

generating a pump current in response to the second up signal and the second down signal;

generating an oscillating output signal at an oscillator frequency in response to the pump current; and filtering the pump current.

59. The method of claim 43, further comprising:

dividing the phase locked output signal to generate the feedback signal.

60. A method of detecting a locked condition in a phase locked loop, comprising:

generating a voltage based on a first difference and a second difference, wherein the first difference is based on a first up signal and a first down signal, and wherein the second difference is based on a second up and a second down signal;

generating a lock signal based on the voltage and wherein the first signal and the second signal are formed on different lines and the first down signal and the second down signal are formed on different lines.

61. A method according to claim 60, wherein the first difference is a first function of phase error and the second difference is a second function of phase error, and wherein generating a voltage based on a first difference and a second difference, comprises:

converting phase error to a voltage based on the first difference and the second difference.

62. A method according to claim 61, wherein the voltage decreases when the first difference is greater than the second difference, and generating a lock signal based on the voltage, comprises:

generating the lock signal when the voltage becomes less than a reference voltage.

63. A method according to claim 62, wherein the first difference corresponds to a first current and the second difference is corresponds to a second current, and wherein converting phase error to a voltage based on the first difference and the second difference, comprises:

generating the first current in response to the first up signal and the first down signal;

generating the second current source that generates the second current in response to the second up signal and the second down signal; and filtering the first and second currents to generate the voltage.

64. A method according to claim 63, wherein the first current generates a first charge and the second current generates a second charge, and wherein the voltage is based on the first charge and the second charge.

* * * * *